US009490270B2

(12) United States Patent
Xu et al.

(10) Patent No.: US 9,490,270 B2
(45) Date of Patent: Nov. 8, 2016

(54) ARRAY SUBSTRATE AND MANUFACTURING METHOD THEREOF, AND DISPLAY DEVICE INCLUDING THE ARRAY SUBSTRATE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Xiangyang Xu, Beijing (CN); Liyun Deng, Beijing (CN); Minsu Kim, Beijing (CN); Binbin Cao, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 226 days.

(21) Appl. No.: 14/380,168

(22) PCT Filed: Dec. 14, 2013

(86) PCT No.: PCT/CN2013/089448
§ 371 (c)(1),
(2) Date: Aug. 21, 2014

(87) PCT Pub. No.: WO2014/187117
PCT Pub. Date: Nov. 27, 2014

(65) Prior Publication Data
US 2016/0240557 A1    Aug. 18, 2016

(30) Foreign Application Priority Data

May 24, 2013   (CN) .......................... 2013 1 0199377

(51) Int. Cl.
*H01L 27/14*      (2006.01)
*H01L 29/04*      (2006.01)
(Continued)

(52) U.S. Cl.
CPC ......... *H01L 27/124* (2013.01); *H01L 21/0274* (2013.01); *H01L 21/32139* (2013.01);
(Continued)

(58) Field of Classification Search
CPC ........... H01L 27/3272; H01L 27/3244; H01L 27/3248
USPC ................................................ 257/59–60, 72
See application file for complete search history.

(56) References Cited

U.S. PATENT DOCUMENTS 8,692,967 B2 * 4/2014 Ting .................. G02F 1/133707
257/59

FOREIGN PATENT DOCUMENTS

CN         1479145 A     3/2004
CN       101241278 A     8/2008
(Continued)

OTHER PUBLICATIONS

Jul. 28, 2015—(CN) First Office Action Appn 201310199377.X with Eng Tran.
(Continued)

*Primary Examiner* — Cuong Q Nguyen
(74) *Attorney, Agent, or Firm* — Banner & Witcoff, Ltd.

(57) ABSTRACT

An array substrate and manufacturing method thereof and a display device having the array substrate are provided. The array substrate includes a non-pixel region distributed in the form of a grid and a plurality of sub-pixel regions formed by being surrounded by the non-pixel region, a plurality of scan lines (12) and data lines (16) disposed in a crossing manner are provided within the non-pixel region, and a common electrode (20) is provided in the sub-pixel regions and the non-pixel region. A zone of the common electrode (20) corresponding to the sub-pixel regions has a first thickness, a zone of the common electrode (20) corresponding to the scan lines (12) and/or the data lines (16) has a second thickness, and the first thickness is smaller than the second thickness. By means of arranging the common electrode (20) to have such a structure that thickness of its zone corresponding to scan lines (12) and/or data lines (16) in a non-pixel region is larger than thickness of its zone corresponding to sub-pixel regions, the ability of conductivity of the common electrode (20) can be enhanced, and this makes the voltage distribution on the whole liquid crystal display panel for the common electrode (20) be more even. Thus, the display quality of picture is improved, and the quality grade of the display device is promoted.

20 Claims, 7 Drawing Sheets

(51) Int. Cl.
    *H01L 27/12*     (2006.01)
    *H01L 29/786*     (2006.01)
    *H01L 29/24*     (2006.01)
    *H01L 21/027*     (2006.01)
    *H01L 21/3213*     (2006.01)
    *H01L 21/4763*     (2006.01)
    *H01L 29/66*     (2006.01)
    *G02F 1/1343*     (2006.01)
    *G02F 1/1362*     (2006.01)

(52) U.S. Cl.
    CPC ..... *H01L21/47635* (2013.01); *H01L 27/1222* (2013.01); *H01L 27/1225* (2013.01); *H01L 27/1288* (2013.01); *H01L 29/24* (2013.01); *H01L 29/66765* (2013.01); *H01L 29/66969* (2013.01); *H01L 29/7869* (2013.01); *H01L 29/78606* (2013.01); *H01L 29/78669* (2013.01); *G02F 1/13439* (2013.01); *G02F 1/134309* (2013.01); *G02F 1/136286* (2013.01); *G02F 2001/134345* (2013.01); *G02F 2001/136295* (2013.01)

(56) References Cited

FOREIGN PATENT DOCUMENTS

| | | |
|---|---|---|
| CN | 102053493 A | 5/2011 |
| CN | 102646715 A | 8/2012 |
| CN | 102707523 A | 10/2012 |
| CN | 203350571 U | 12/2013 |
| KR | 1020110046331 A | 5/2011 |

OTHER PUBLICATIONS

Nov. 24, 2015—International Preliminary Report on Patentability Appn PCT/CN2013/089448.

* cited by examiner

FIG. 6B
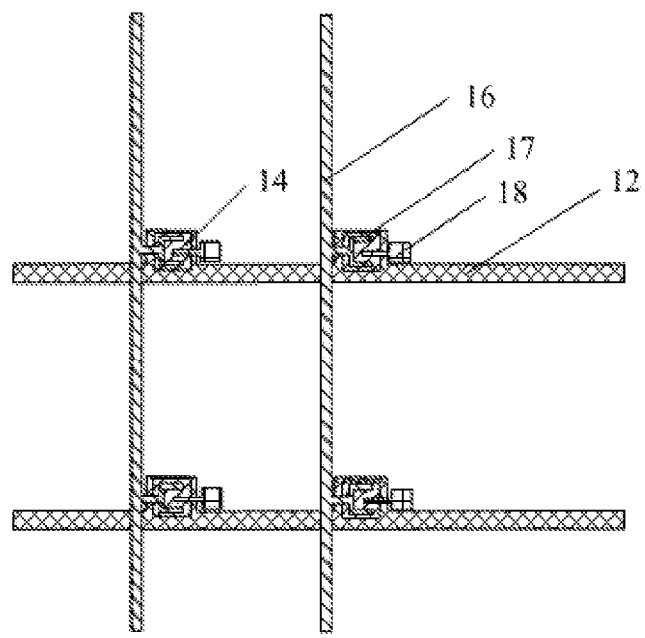
FIG. 5C
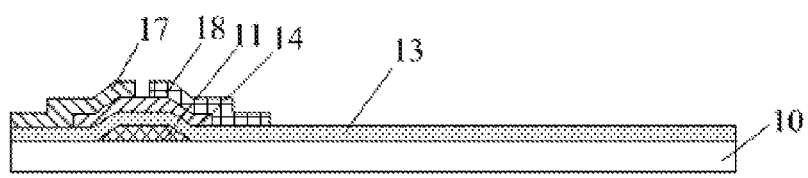
FIG. 6C

ARRAY SUBSTRATE AND MANUFACTURING METHOD THEREOF, AND DISPLAY DEVICE INCLUDING THE ARRAY SUBSTRATE

CROSS REFERENCE TO RELATED APPLICATIONS

This application is based on International Application No. PCT/CN2013/089448 filed on Dec. 14, 2013, which claims priority to Chinese National Application No. 201310199377.X filed on May 24, 2013. The entire contents of each and every foregoing application are incorporated herein by reference.

TECHNICAL FIELD

Embodiments of the present invention relates to a field of display technology, and more particularly, to an array substrate and manufacturing method thereof, and a display device including the array substrate.

BACKGROUND

With the development of science and technology, flat panel display devices have replaced bulky cathode ray tube (CRT) display devices and increasingly penetrated into people's daily life, and liquid crystal display devices (LCDs) are a kind of flat panel display devices. The main constituent component of a liquid crystal display device is a liquid crystal panel, which mainly includes a color film substrate and an array substrate with liquid crystals filled therebetween. In the array substrate or the color film substrate, there are further provided electrodes, which are useful for generating electric fields and by which, distribution of the electric fields is determined, and the distribution of the electric fields determines deflection of liquid crystals, and thus affects display of the liquid crystal panel. Each of pixel points in the liquid crystal display device has a pixel electrode and a common electrode opposed to it that are provided therein. In the course of imaging, the pixel electrode is controlled by a thin film transistor (briefly called as TFT) and a storage capacitance (briefly referred to as Cs hereinafter, and also referred to as a pixel capacitance) that are integrated in the array substrate to implement an active driving, so that the image display is realized. The thin film transistor, functioning as a switch in control of a voltage supplied to the pixel electrode, is a key for realizing display of the LCD display device, and is directly related to the development direction of flat panel display devices with high performance.

With the development of display technology, and meanwhile for the sake of meeting people's demands for high brightness, high contrast, and low energy consumption, the ADvanced Super Dimension Switch (briefly called as ADS, and also called as ADSDS) technology emerges as the times require. In the prior art, an ADS type array substrate generally includes a pixel electrode and a common electrode located on the same side of a liquid crystal cell, and a multi-dimensional electric field produced between the pixel electrode and the common electrode allows every liquid crystal molecule within the liquid crystal cell to be deflected. Thus, the work efficiency of liquid crystals is enhanced and the viewing angle is increased. Liquid crystal display devices that employ the ADvanced Super Dimension Switch technology have the merits of high aperture ratio of pixel, wide viewing angle, high brightness, low energy consumption, etc.

As the improvement of the ADS technology, high transmittance I-ADS technology, high aperture ADS (briefly called as H-ADS), high resolution S-ADS technology and so on emerge currently. In general, the pixel electrode and the common electrode in the array substrate may include the following two structures. The first structure is that, in a sub-pixel area, the electrode in a lower level is a plate-like common electrode, and the electrode in an upper level is a slit-like pixel electrode; and the second structure is that, in a sub-pixel area, the electrode in a lower level is a plate-like pixel electrode, and the electrode in an upper level is a slit-like common electrode. As illustrated in FIG. 1A and FIG. 1B, a common electrode 20 has a slit-like structure, a pixel electrode is a plate-like electrode. Moreover, the thickness of the common electrode 20 is fixed, and conductivity of the common electrode 20 is smaller so that its power supply ability is weak.

As the provider of a common reference voltage, the principle function of the common electrode lies in that it can maintain a stable reference point for common voltage. Yet, because of special properties of liquid crystals, alternating current drive modes, such as frame inversion, row inversion, column inversion, dot inversion and other mode are usually adopted in liquid crystal display devices. Owing to the presence of Cs and other parasitic capacitance, in an AC drive mode, an AC signal will bring an effect on the common voltage so that it is pulled up or down periodically. If conductive properties of the common electrode are not good, it will affect the display quality of picture of the display device. For example, the display of an image is also accompanied by Greenish, Flick, Crosstalk and other phenomenon.

In order to ensure that a TFT in a sub-pixel area works stably, it is necessary for charges stored on the Cs to maintain the drive voltage of the TFT continually, so that liquid crystal molecules are kept in a stable operating state in a frame period. Accordingly, how to ensure the stability of a voltage across the common electrode in the array substrate, to raise the power supply capability of the common electrode, and to improve the quality of display pictures, become urgent problems that need solving in the industry at present.

SUMMARY

According to embodiments of the invention, there are provided an array substrate and manufacturing method thereof, and a display device, capable of solving at least one of the above issues existing in the prior art. A common electrode of the array substrate can have a stronger ability of conductivity, so that the voltage distribution of the common electrode on the whole display panel is more uniform.

According to an aspect of the invention, there is provided an array substrate, comprising a non-pixel region distributed in a form of grid and a plurality of sub-pixel regions formed by being surrounded by the non-pixel region, wherein a plurality of scan lines and data lines disposed in a crossing manner are provided within the non-pixel region, a common electrode is provided in both the sub-pixel regions and the non-pixel region, a zone of the common electrode corresponding to the sub-pixel regions has a first thickness, a zone of the common electrode corresponding to the scan lines and/or the data lines has a second thickness, and the first thickness may be smaller than the second thickness.

In an embodiment, the common electrode may be formed with at least one material selected from the group consisting of indium gallium zinc oxide, indium zinc oxide, indium tin oxide or indium gallium tin oxide.

In an embodiment, a portion of the common electrode from its bottom surface to the first thickness in a region corresponding to the sub-pixel regions, the scan lines and/or the data lines may be formed with at least one material selected from the group consisting of indium gallium zinc oxide, indium zinc oxide, indium tin oxide or indium gallium tin oxide; and a portion of the common electrode from the first thickness to the second thickness in a region corresponding to the scan lines and/or the data lines may be formed with at least one material selected from the group consisting of molybdenum, an alloy of molybdenum and niobium, aluminum, an alloy of aluminum and neodymium, titanium or copper.

In an embodiment, a gate electrode, a gate insulating layer, an active layer, a source electrode and a drain electrode, a pixel electrode and a passivation layer may be provided within the sub-pixel regions, wherein, a scan line may be electrically connected to the gate electrode, a data line may be electrically connected to the source electrode, the pixel electrode may be electrically connected to the drain electrode, and the common electrode may be extended to cover the scan lines and/or the data lines.

In an embodiment, an organic thin film layer may be provided between source and drain electrodes and a pixel electrode, and may be formed with a resin material containing a photosensitive material.

In an embodiment, the active layer may be formed with at least one material selected from the group consisting of indium gallium zinc oxide, indium zinc oxide, indium tin oxide or indium gallium tin oxide; or, the active layer may be formed with amorphous silicon material.

In an embodiment, the common electrode may be disposed on the passivation layer, and is distributed in a form of slit within a region corresponding to the sub-pixel regions; or, the pixel electrode may be disposed on the passivation layer, and is distributed in the form of slit within a region corresponding to the sub-pixel regions.

In an embodiment, the second thickness may be in the range of 550 Å to 1000 Å, and the first thickness may be in the range of 300 Å to 500 Å.

According to another aspect of the invention, there is provided a display device, comprising the above array substrate.

According to another aspect of the invention, there is provided a manufacturing method of an array substrate, comprising: a step of forming a plurality of scan lines and data lines disposed in a crossing manner, wherein the array substrate is divided by the scan lines and the data lines into a non-pixel region distributed in a form of grid and a plurality of sub-pixel regions formed by being surrounded by the non-pixel region; and a step of forming a pattern including a common electrode over the sub-pixel regions, the scan lines and/or the data lines, wherein a zone of the common electrode corresponding to the sub-pixel regions has a first thickness, a zone of the common electrode corresponding the scan lines and/or the data lines has a second thickness, and the first thickness is smaller than the second thickness.

In an embodiment, forming the pattern including the common electrode may include the following steps.

Step S11): forming a conductive film layer;

Step S12): forming a photoresist layer on the conductive film layer;

Step S13): conducting exposure and development on the photoresist layer with a double-tone mask so that the photoresist layer is provided with a fully-retained region, a partially-retained region and a fully-removed region, the photoresist of the photoresist layer corresponding to the fully-retained region being fully retained, the photoresist corresponding to the partially-retained region being partially retained, and the photoresist corresponding to the fully-removed region being fully removed;

Step S14): performing an etch on the conductive film layer subjected to the step S13), so as to form slits of the common electrode in a region corresponding to the sub-pixel regions;

Step S15): conducting an ashing treatment on the photoresist layer subjected to the step S14), so as to remove the partially-retained photoresist in the photoresist layer by ashing;

Step S16): performing an etch on the conductive film layer subjected to the step S15), so as to decrease thickness of the conductive film layer within the sub-pixel regions, and meanwhile, to form pattern of the common electrode in a region corresponding to the scan lines and/or the data lines;

Step S17): stripping off the remaining photoresist.

In an embodiment, in the step S11), it is possible that the conductive film layer is formed by way of deposition, sputtering or thermal evaporation with at least one material selected from the group consisting of indium gallium zinc oxide, indium zinc oxide, indium tin oxide or indium gallium tin oxide, wherein, a thickness of the conductive film layer may be equal to the second thickness;

or, in the event that the conductive film layer includes a first conductive film layer and a second conductive film layer, firstly, the first conductive film layer is formed by way of deposition, sputtering or thermal evaporation with at least one material selected from the group consisting of indium gallium zinc oxide, indium zinc oxide, indium tin oxide and indium gallium tin oxide; then, the second conductive film layer is formed on the first conductive film layer by way of sputtering or thermal evaporation with at least one material selected from the group consisting of molybdenum, an alloy of molybdenum and niobium, aluminum, an alloy of aluminum and neodymium, titanium or copper, wherein, a thickness of the first conductive film layer is equal to the first thickness, and a thickness of the second conductive film layer is equal to difference between the second thickness and the first thickness.

In the step S16), after the etch, the second conductive film layer within the sub-pixel regions is removed completely and the first conductive film layer within the sub-pixel regions is exposed fully.

In an embodiment, in the step S13), for the double-tone mask, its zone corresponding to slits of the common electrode is set as the fully-removed region, its zone corresponding to other portion than the slits within the sub-pixel regions is set as the partially-retained region, and its zone corresponding to the scan lines and/or the data lines is set as the fully-retained region.

According to embodiments of the invention, by means of arranging the common electrode to have such a structure that thickness of its zone corresponding to scan lines and/or data lines is larger than thickness of its zone corresponding to sub-pixel regions, and accordingly, achieving manufacture of such a structure of the common electrode with unequal thicknesses with the use of an ashing process, the ability of conductivity of the common electrode can be enhanced, and this makes the voltage distribution on the whole liquid crystal display panel for the common electrode be more even and more stable. Thus, the display quality of picture is improved, and the quality grade of the display device is promoted.

BRIEF DESCRIPTION OF THE DRAWINGS

FIGS. 5A-5D, FIG. 5F and FIGS. 6A-6F are schematically plan view illustrating the manufacturing flow chart of the array substrate in FIG. 3A and sectional views taken along line A-A in FIG. 3A, respectively;

Figure 5A:
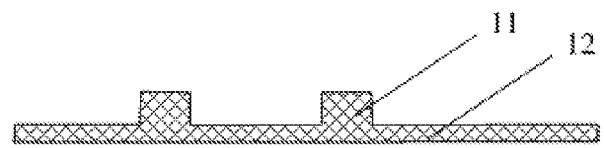
Figure 5A:
Figure 6A:
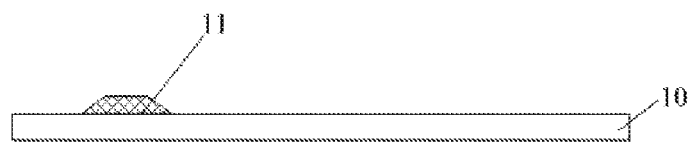
Figure 5B:
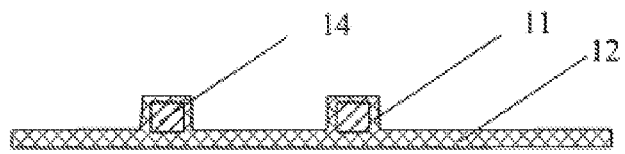
Figure 5B:
Figure 6B:
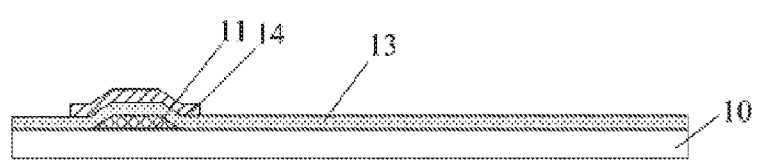
Figure 5D:
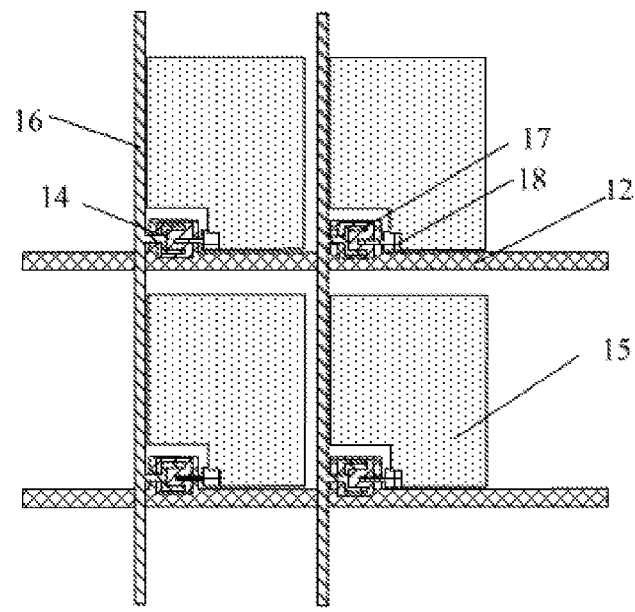
Figure 6D:
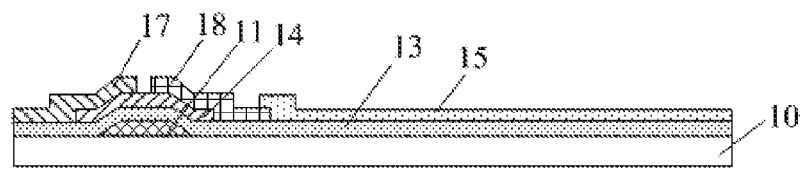
Figure 6E:
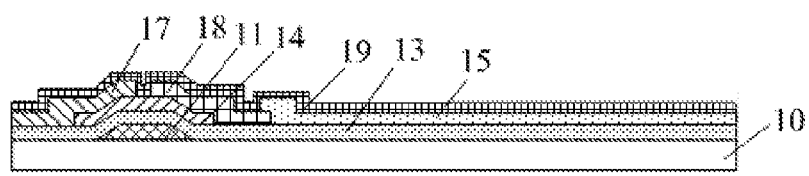
Figure 5F:
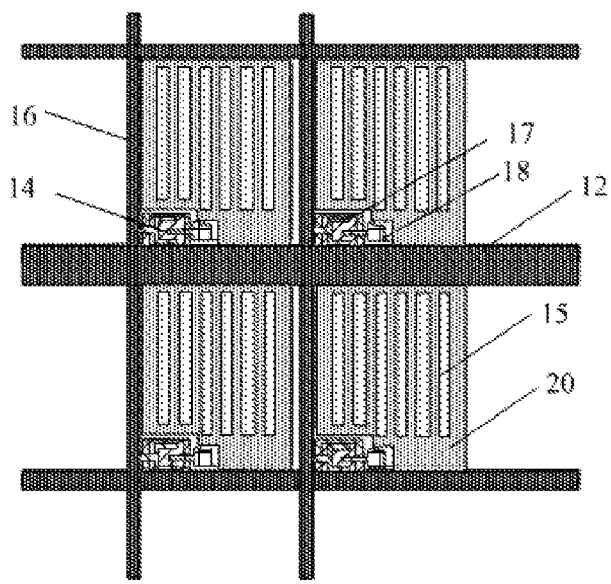
Figure 6F:
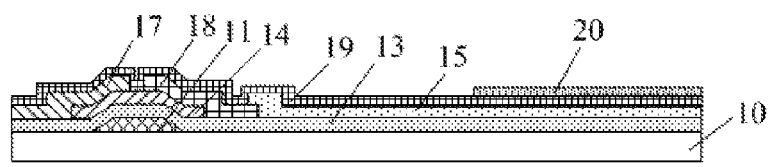

wherein:

FIG. 5A is schematically plan view illustrating formation of a pattern including a gate electrode;

FIG. 6A is a sectional view corresponding to FIG. 5A;

FIG. 5B is schematically plan view illustrating formation of a pattern including a gate insulating layer and an active layer;

FIG. 6B is a sectional view corresponding to FIG. 5B;

FIG. 5C is schematically plan view illustrating formation of a pattern including a source electrode and a drain electrode;

FIG. 6C is a sectional view corresponding to FIG. 5C;

FIG. 5D is schematically plan view illustrating formation of a pattern including a pixel electrode;

FIG. 6D is a sectional view corresponding to FIG. 5D;

FIG. 6E is a sectional view illustrating formation of a pattern including a passivation layer;

FIG. 5F is schematically plan view illustrating formation of a pattern including a common electrode;

FIG. 6F is a sectional view corresponding to FIG. 5F.

DETAILED DESCRIPTION

In order to make those skilled in the art understand technical solutions of the invention better, hereinafter, an array substrate, a manufacturing method and a display device of the invention will be described in detail further in combination with accompanied drawings and specific embodiments.

First Embodiment

Figure 1A:
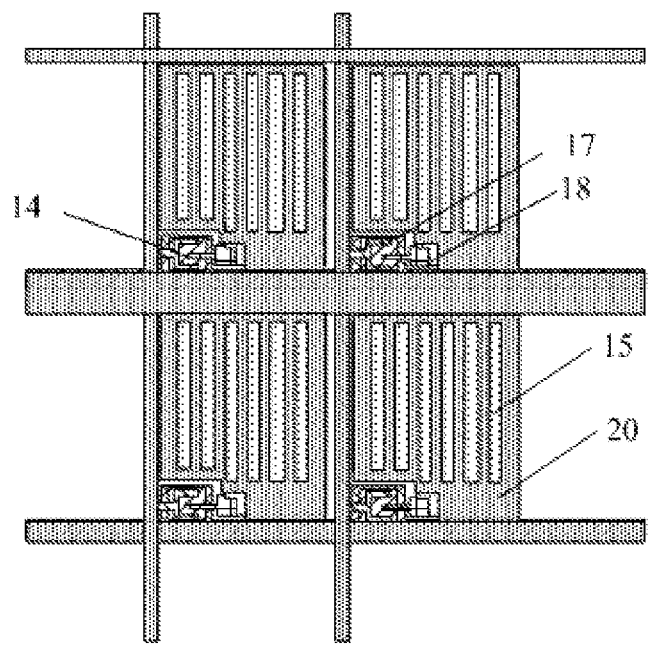
FIG. 1A is a schematically plan view illustrating an array substrate in prior art.
Figure 1B:
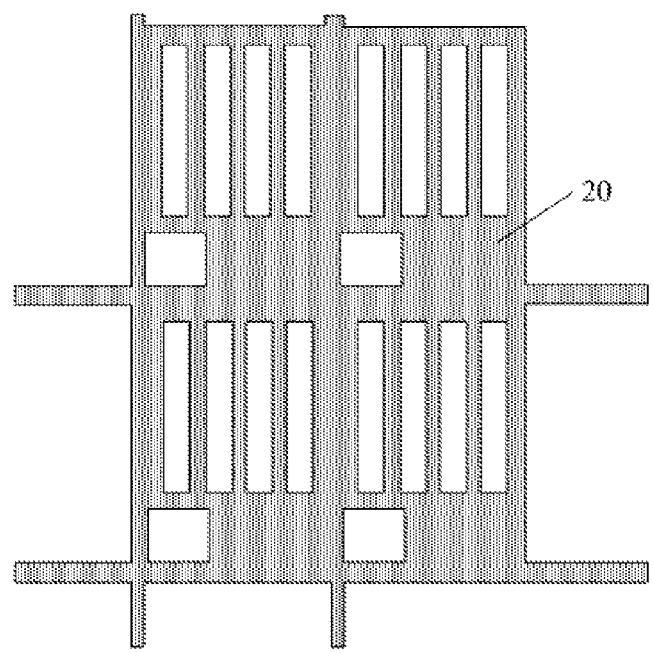
FIG. 1B is a schematically plan view illustrating a common electrode in FIG. 1A.
Figure 2:
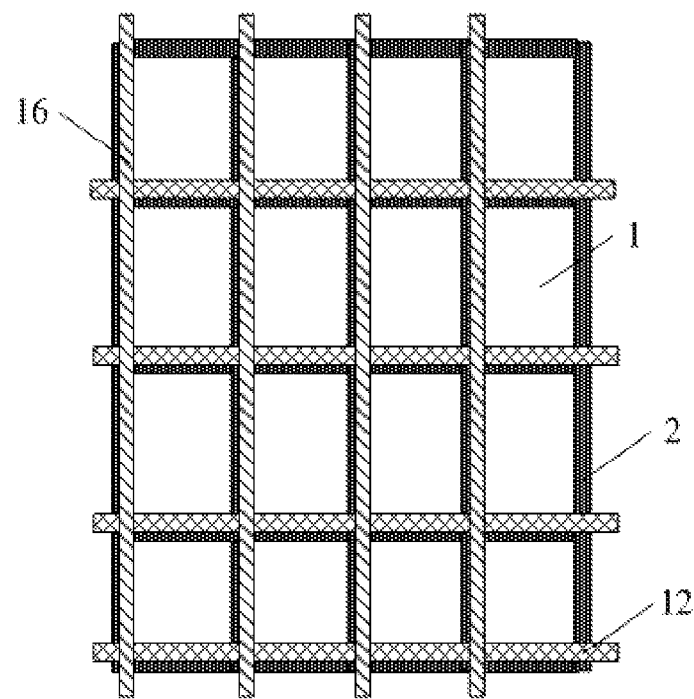
FIG. 2 is a schematically plan view illustrating sub-pixel regions and a non-pixel region in an array substrate.

As illustrated in FIG. 2, according to the embodiment, there is provided an array substrate, comprising a non-pixel region 2 distributed in the form of a grid and a plurality of sub-pixel regions 1 formed by being surrounded by the non-pixel region 2, and a plurality of scan lines 12 and data lines 16 disposed in a crossing manner are provided within the non-pixel region 2. A common electrode 20 may be provided in the sub-pixel regions 1 and the non-pixel region 2. A zone of the common electrode 20 corresponding to the sub-pixel regions 1 may have a first thickness, a zone of the common electrode 20 corresponding to the scan lines 12 and/or the data lines 16 may have a second thickness, and the first thickness may be smaller than the second thickness. Namely, in the embodiment, thickness of the zone of the common electrode 20 corresponding to the scan lines may be larger than thickness of the zone of the common electrode 20 corresponding to the sub-pixel regions 1, or, thickness of the zone of the common electrode 20 corresponding to the data lines may be larger than thickness of the zone of the common electrode 20 corresponding to the sub-pixel regions 1; or, each of thicknesses of zones of the common electrode 20 corresponding to the scan lines and the data lines may be larger than thickness of the zone of the common electrode 20 corresponding to the sub-pixel regions 1.

Figure 3A:
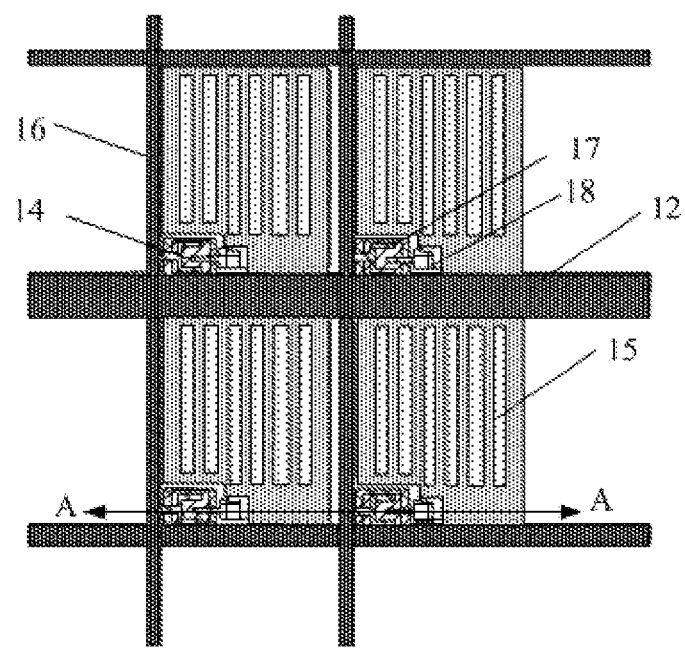
FIG. 3A is a schematically plan view illustrating an array substrate according to a first embodiment of the invention.
Figure 3B:
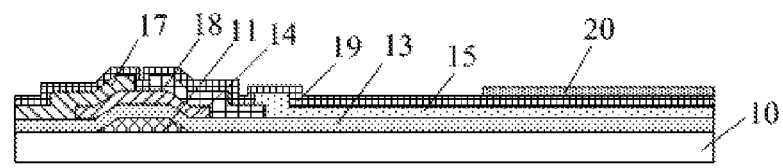
FIG. 3B is a sectional view taken along line A-A in FIG. 3A.
Figure 4:
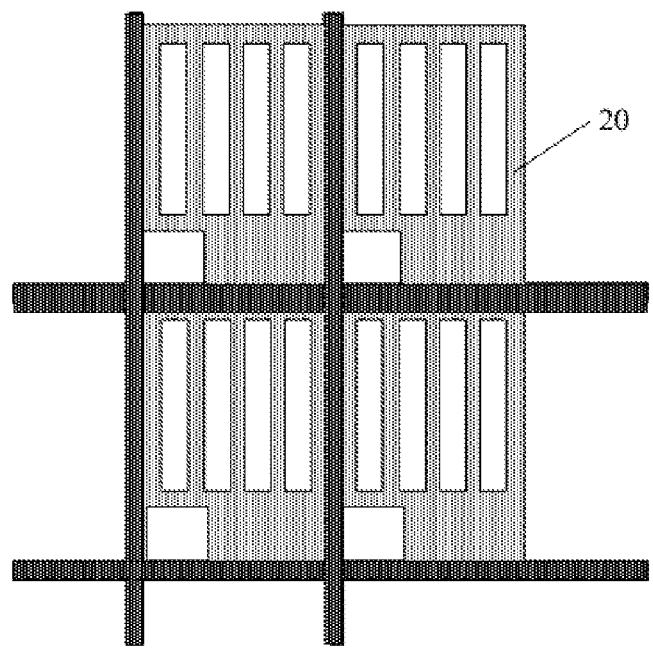
FIG. 4 is a schematically plan view illustrating a common electrode in FIG. 3A.

In the embodiment, as illustrated in FIGS. 3A and 3B, a gate electrode 11, a gate insulating layer 13, an active layer 14, a source electrode 17 and a drain electrode 18 lying in the same layer, a pixel electrode 15, a passivation layer 19 and a common electrode 20 may be provided within a sub-pixel region 1. A scan line 12 may be electrically connected to the gate electrode 11, a data line 16 may be electrically connected to the source electrode 17, and the common electrode 20 may be disposed on the passivation layer 19. In the embodiment, as illustrated in FIG. 4, the common electrode 20 is extended to an area that covers the scan line 12 and the data line 16, and each of thicknesses of zones of the common electrode 20 corresponding to the scan line 12 and the data line 16 is larger than thickness of the zone of the common electrode 20 corresponding to the sub-pixel region 1 (in FIG. 4, the thickness difference between the sub-pixel region 1 and the non-pixel region 2 for the common electrode 20 is indicated by color shade, and thickness of a deep-color area is larger than thickness of a shallow-color area).

The common electrode 20 may be formed with at least one material selected from the group consisting of indium gallium zinc oxide, indium zinc oxide, indium tin oxide or indium gallium tin oxide. In the common electrode 20, the second thickness may be in the range of 550 Å to 1000 Å, and the first thickness may be in the range of 300 Å to 500 Å. Within a region corresponding to a sub-pixel region 1, the common electrode 20 is distributed in the form of a slit.

Furthermore, the gate electrode 11, the source electrode 17 and the drain electrode 18 each can be formed with at least one material selected from the group consisting of molybdenum, an alloy of molybdenum and niobium, aluminum, an alloy of aluminum and neodymium, titanium or copper. The gate insulating layer 13 may be formed with at least one material selected from the group consisting of silicon oxide, silicon nitride, hafnium oxide, silicon oxynitride, or aluminum oxide. The active layer 14 may be formed with amorphous silicon material. The passivation layer 19 may be formed with at least two materials of silicon oxide, silicon nitride, hafnium oxide and aluminum oxide.

Prior to description of a specific manufacturing method, it should be understood that, in an embodiment of the invention, the patterning process may only include a photolithography process, or may include a photolithography process and an etch step, and besides, it may also include printing, inkjet or other process for forming a predetermined pattern. The photolithography process refers to a process in which a pattern is formed by utilizing photoresist, a mask, an exposing machine and so on, including film formation, exposure, development and other process procedure. A corresponding patterning process may be selected in accordance with a structure to be formed in an embodiment of the invention. Here, positive photoresist is given as an example of the photoresist, but embodiments of the invention are not limited thereto.

A manufacturing method of the above array substrate may include: a step of forming a plurality of scan lines and data lines that are disposed in a crossing manner, wherein, the array substrate is divided by the scan lines and the data lines into a non-pixel region distributed in the form of a grid and a plurality of sub-pixel regions formed by being surrounded by the non-pixel region; a step of forming a pattern including a common electrode over the sub-pixel regions, the scan lines and/or the data lines, wherein, a zone of the common electrode corresponding to the sub-pixel regions has a first thickness, a zone of the common electrode corresponding to the scan lines and/or the data lines has a second thickness, and the first thickness may be smaller than the second thickness.

In the embodiment, as illustrated in FIGS. 5A-5D, FIG. 5F and FIGS. 6A-6F, a manufacturing method of the array substrate may include the following steps.

Step S1): a pattern including a gate electrode is formed on a substrate.

In this step, a metal thin film (i.e. a gate electrode metal thin film) is formed on a substrate 10, and a pattern including a gate electrode 11 and a scan line 12 is formed on the substrate 10 through one patterning process, as illustrated in FIG. 5A and FIG. 6A. A deposition method, a sputtering method or a thermal evaporation method may be used to form the metal thin film. In the patterning process, a layer of photoresist may be formed on the metal thin film firstly, and then exposure, development, etching and stripping may be conducted on the photoresist with a mask, so as to form the pattern including the gate electrode 11 and the scan line 12.

In this step, a common electrode connecting line may also be formed in a zone of the substrate corresponding to the non-pixel region (usually located at an edge of the substrate) at this time, and is left over for electrical connection with a common electrode formed subsequently. The structure and manufacturing method of the common electrode connecting line are the same as those in prior art, and details are omitted here.

Here, for the sake of illustrating sectional structures of the array substrate in the embodiment during its manufacture more clearly, a sectional view 5A and a plan view 6A are set at different scales. Meanwhile, for ease of understanding the structure of each layer of a thin film transistor and the positional relationship between layers, each layer in the plan view 5A is arranged to have a certain transparency. Each plan view and each sectional view below are similar to this.

Step S2): a pattern including a gate insulating layer and an active layer is formed on the substrate subjected to the step S1).

In this step, a gate insulating layer thin film and an active layer thin film are sequentially formed on the substrate 10 subjected to the step S1), and a pattern including an active layer 14 is formed through one patterning process. A chemical vapor deposition (briefly called as CVD) method may be used to form the gate insulating layer thin film, and a gate insulating layer 13 is arranged to cover the whole substrate subjected to the step S1). In the patterning process, a layer of photoresist is formed on the active layer thin film firstly, and then exposure, development, etching and stripping are conducted on the photoresist with a mask, so as to form the pattern including the active layer 14, as illustrated in FIG. 5B and FIG. 6B.

In the embodiment, the active layer 14 may be formed with amorphous silicon material. Here, because the gate insulating layer 13 covers the whole substrate 10, and the gate insulating layer is usually formed with a transparent material (at least one material of silicon oxide, silicon nitride, hafnium oxide, silicon oxynitride, and aluminum oxide), the gate insulating layer will not cause a hindrance to the viewing of a plan view. Thus, the gate insulating layer 13 is not illustrated in the schematically plan view of FIG. 5B, so that the relative position relationship between the gate electrode 11, the scan line 12 and the active layer 14 can be illustrated better.

Step S3): a pattern including a source electrode and a drain electrode is formed on the substrate subjected to the step S2).

In this step, a metal thin film is formed on the substrate 10 subjected to the step S2) (namely, a metal thin film for a source electrode and a drain electrode is formed), and a pattern including a source electrode 17, a drain electrode 18 and a data line 16 are formed through one patterning process, wherein, the source electrode 17 and the drain electrode 18 are located over the active layer 14 and at two opposite sides relative to the gate electrode 11. A deposition method, a sputtering method or a thermal evaporation method may be used to form the metal thin film. In the patterning process, it is possible that a layer of photoresist is formed on the metal thin film firstly, and then exposure, development, etching and stripping are conducted on the photoresist with a mask, so as to form the pattern including the source electrode 17, the drain electrode 18 and the data line 16, as illustrated in FIG. 5C and FIG. 6C.

Step S4): a pattern including a pixel electrode is formed on the substrate subjected to the step S3).

In this step, a pixel electrode thin film is formed on the substrate 10 subjected to the step S3), and a pattern including a pixel electrode 15 is formed through one patterning process. A deposition method, a sputtering method or a thermal evaporation method may be used to form the pixel electrode thin film. In the patterning process, it is possible that a layer of photoresist is formed on the pixel electrode thin film firstly, and then exposure, development, etching and stripping are conducted on the photoresist with a mask, so as to form the pattern including the pixel electrode 15, to which the drain electrode 18 may be directly, electrically connected, as illustrated in FIG. 5D and FIG. 6D.

Step S5): a pattern including a passivation layer is formed on the substrate subjected to the step S4), as illustrated in FIG. 6E.

In this step, a passivation layer 19 covers the whole substrate 10. Similar to the gate insulating layer 13, the passivation layer 19 is usually formed with a transparent material (e.g., silicon oxide, silicon nitride, hafnium oxide or aluminum oxide), so it will not cause a hindrance to the viewing of a plan view. Thus, the passivation layer is not illustrated in a corresponding, schematic plan view.

Step S6): a pattern including a common electrode is formed on the substrate subjected to the step S5).

In this step, a common electrode thin film is formed on the substrate 10 subjected to the step S5), and a pattern including a common electrode 20 is formed on the passivation layer 19 through one patterning process. A deposition method, a sputtering method or a thermal evaporation method may be used to form the common electrode thin film. In the patterning process, it is possible that a layer of photoresist is formed on the common electrode thin film firstly, and then exposure, development, etching and stripping are conducted on the photoresist with a double-tone mask (such as a half-tone mask or a gray-tone mask), so as to form the pattern including the common electrode 20, as illustrated in FIG. 5F and FIG. 6F.

In addition, in a non-pixel region of the array substrate, the passivation layer 19 has a via hole established at the location corresponding to the common electrode connecting line, and the common electrode 20 may be electrically connected to the common electrode connecting line through the via hole. As stated above, the common electrode connecting line may be formed on the substrate 10 simultaneously with the gate electrode 11 and the scan line 12, and in this step, it only has to be guaranteed that the common electrode connecting line is electrically connected to the common electrode 20.

Specifically, a passivation layer thin film is formed on the substrate 10 subjected to the step S4), and pattern of a passivation layer 19 is formed through one patterning process, so that it covers a part of the source electrode 17, the drain electrode 18 and the pixel electrode 15.

A deposition method, a sputtering method or a thermal evaporation method may be used to form the passivation layer thin film. In the patterning process, it is possible that a layer of photoresist is coated on the passivation layer thin film firstly, and then exposure, development, etching and stripping are conducted on the photoresist with a mask, so as to form a pattern including the passivation layer 19.

As manufacturing processes for forming other layers than the common electrode of the thin film transistor (namely, for forming a gate electrode 11, a gate insulating layer 13, an active layer 14, a source electrode 17, a drain electrode 18, a pixel electrode 15 and a passivation layer 19 within a sub-pixel region 1) are the same as those in the prior art, details are omitted here.

A manufacturing method of the common electrode 20 of the array substrate may include the following steps concretely.

Step S611): a conductive film layer is formed on a passivation layer.

In this step, it is possible that a conductive film layer is formed on the passivation layer 19 by means of deposition, sputtering or thermal evaporation with at least one material of indium gallium zinc oxide, indium zinc oxide, indium tin oxide, and indium gallium tin oxide, in which, thickness of the conductive film layer may be equal to the second thickness.

Step S612): photoresist is formed on the conductive film layer.

In the embodiment, the photoresist may adopt positive photoresist or negative photoresist, and a layer of photoresist is formed on the conductive film layer by means of coating.

Step S613): exposure and development are conducted on the photoresist with a double-tone mask that is provided with a fully-retained region, a partially-retained region and a fully-removed region, so that a zone of the photoresist corresponding to the fully-retained region is fully retained, a zone of the photoresist corresponding to the partially-retained region is partially retained, and a zone of the photoresist corresponding to the fully-removed region is fully removed.

For the double-tone mask, its zone that corresponds to slits of the common electrode may be set as the slit-like fully-removed region, its zone that corresponds to other portions than the slits in sub-pixel regions 1 may be set as the partially-retained region, and its zone that corresponds to the region of the scan lines and/or the data lines may be set as the fully-retained region.

After a step of exposure and development, a zone of the photoresist that corresponds to the fully-removed region of the double-tone mask may be removed completely. If positive photoresist is used as the photoresist, then a part of the positive photoresist that has been irradiated by light during exposure is easy to be dissolved in a developer with the help of a photosensitive chemical reaction, so as to be removed. On the contrary, if negative photoresist is used as the photoresist, then a part of the negative photoresist that has been irradiated by light during exposure is not easy to be dissolved in a developer with the help of a photosensitive chemical reaction, so as to be retained.

Step S614): etching is performed on the conductive film layer subjected to the step S613), so as to form slits in the conductive film layer within sub-pixel regions, which also become slits in the ultimately formed common electrode.

In this step, a wet etch process may be used for the etching. After the etching step, the conductive film layer corresponding to slits of the common electrode is removed fully, so as to form slits of the common electrode in sub-pixel regions 1.

Step S615): an ashing treatment is conducted on the photoresist subjected to the step S614), so as to remove the partially-retained photoresist by ashing.

In this step, the photoresist in a zone of the sub-pixel regions 1 corresponding to the partially-retained region of the double-tone mask is further removed completely, so that the conductive film layer within the sub-pixel regions 1 is exposed fully.

Step S616): etching is performed on the conductive film layer subjected to the step S615), and by this etching, thickness of the conductive film layer within the sub-pixel regions is decreased, and meanwhile, pattern of the common electrode in a region corresponding to the scan lines and/or the data lines is formed.

In this step, a wet etch process may be used for the etching, and after this etching step, the conductive film layer corresponding to sub-pixel regions 1 becomes thinned, so as to have a first thickness; while the conductive film layer in a region corresponding to the scan lines 12 and/or the data lines 16 is retained fully, so as to have the second thickness that is larger than the first thickness. Thus, a complete pattern of the common electrode 20 is formed.

Step S617): the remaining photoresist is stripped off.

In this step, the remaining photoresist is removed completely, namely, the photoresist in a region corresponding to the scan lines and/or the data lines is removed fully, so as to expose the conductive film layer in a region corresponding to the scan lines and/or the data lines.

Up to here, manufacture of the array substrate is finished.

In the embodiment, a common electrode with unequal thicknesses is formed in the sub-pixel regions 1 and the non-pixel region 2 through a double-tone mask. In a portion of the common electrode that is thicker, a corresponding conductivity is larger, the resistivity is smaller, and a corresponding resistance is smaller; and in a portion of the common electrode that is thinner, a corresponding conductivity is smaller, the resistivity is larger, and a corresponding resistance is larger. Therefore, the voltage distribution of the common electrode over the sub-pixel regions 1 and the non-pixel region 2 can be balanced, so that the distribution of a voltage supplied by the common electrode 20 within the whole display area is more even and more stable.

In the above array substrate, the electrode lying in a lower level is a plate-like pixel electrode, which is electrically connected to a drain electrode of a TFT, while the electrode lying in an upper level is a slit-like common electrode. A multi-dimensional electric field is jointly formed by an electric field produced between edges of slit electrodes and a plate-like electrode layer and an electric field produced between the slit electrodes, so that every liquid crystal molecule within a liquid crystal cell can be deflected. Thus, the image display is realized.

Second Embodiment

The difference between the embodiment and the first embodiment lies in that, in the embodiment, a common electrode 20 in an array substrate may be formed of two different materials, namely, a portion of the common electrode 20 in a region corresponding to scan lines and/or data lines that is protruded relative to the common electrode in sub-pixel regions 1 may be formed with a material having a higher conductivity.

Specifically, a portion of the common electrode 20 from its bottom surface to the first thickness in a region corresponding to the sub-pixel regions 1, the scan lines and/or the data lines may be formed with at least one material selected from the group consisting of indium gallium zinc oxide, indium zinc oxide, indium tin oxide or indium gallium tin oxide; and a portion of the common electrode 20 from the first thickness to the second thickness in a region corresponding to the scan lines and/or the data lines may be formed with at least one material selected from the group consisting of molybdenum, an alloy of molybdenum and niobium, aluminum, an alloy of aluminum and neodymium, titanium or copper.

Accordingly, a manufacturing method of the array substrate in the embodiment may include the following steps concretely.

Step S600): other layers than the common electrode of the array substrate are formed.

In this step, the uppermost layer of the array substrate is a passivation layer.

Step S611): a conductive film layer is formed on the passivation layer.

In this step, the conductive film layer may include a first conductive film layer and a second conductive film layer. It is possible that the first conductive film layer is formed on the passivation layer by way of sputtering or thermal evaporation at first with at least one material of indium gallium zinc oxide, indium zinc oxide, indium tin oxide and indium gallium tin oxide; and then, the second conductive film layer is formed on the first conductive film layer by way of sputtering or thermal evaporation with at least one material of molybdenum, an alloy of molybdenum and niobium, aluminum, an alloy of aluminum and neodymium, titanium and copper. Thickness of the first conductive film layer may be equal to the first thickness, and thickness of the second conductive film layer may be equal to difference between the second thickness and the first thickness. The range of the second thickness may be 550 Å to 1000 Å, and the range of the first thickness may be 300 Å to 500 Å.

Step S612): photoresist is formed on the conductive film layer.

Step S613): exposure and development are conducted on the photoresist with a double-tone mask that is provided with a fully-retained region, a partially-retained region and a fully-removed region, so that a zone of the photoresist corresponding to the fully-retained region is fully retained, its zone corresponding to the partially-retained region is partially retained, and its zone corresponding to the fully-removed region is removed completely.

For the double-tone mask, its zone that corresponds to slits of the common electrode is set as the slit-like fully-removed region, its zone that corresponds to other portions than the slits in sub-pixel regions 1 is the partially-retained region, and its zone that corresponds to the region of the scan lines and/or the data lines is set as the fully-retained region.

After a step of exposure and development, the photoresist that corresponds to the slits in the common electrode may be removed completely.

Step S614): etching is performed on the conductive film layer subjected to the step S613), so as to form slits in the conductive film layer within sub-pixel regions.

In this step, a wet etch process may be used for the etching. After the etching step, the conductive film layer corresponding to slits in the common electrode is removed fully, so as to form slits of the common electrode.

Step S615): an ashing treatment is conducted on the photoresist subjected to the step S614), so as to remove the partially-retained photoresist by ashing.

In this step, the photoresist in a zone of the sub-pixel regions 1 corresponding to the partially-retained region of the double-tone mask is further removed completely, so that the second conductive film layer within the sub-pixel regions 1 is exposed fully.

Step S616): etching is performed on the conductive film layer subjected to the step S615).

In this step, a wet etch process may be used for the etching, and after this etching step, the second conductive film layer within sub-pixel regions 1 is removed fully to expose the first conductive film layer completely, thereby forming a partial pattern of the common electrode 20 corresponding to sub-pixel regions 1, wherein this part of common electrode has a first thickness; while the second conductive film layer in a region corresponding to the scan lines 12 and/or the data lines 16 is retained fully, and this part of common electrode (including a first conductive film layer and a second conductive film layer) has a second thickness that is larger than the first thickness. Thus, a complete pattern of the common electrode 20 is formed.

Step S617): the remaining photoresist is stripped off.

In this step, the remaining photoresist is removed completely, namely, the photoresist in a region corresponding to the scan lines and/or the data lines is removed fully, so as to expose the second conductive film layer in a region corresponding to the scan lines and/or the data lines.

Up to here, manufacture of the array substrate is finished.

Other structure of the array substrate in the embodiment is the same as the structure of the array substrate in the first embodiment, other steps of the manufacturing method are the same as the manufacturing method of the array substrate in the first embodiment, and details are omitted here.

Third Embodiment

The difference between the embodiment of the first and second embodiments lies in that, in an array substrate according to the embodiment, an organic thin film layer may be further provided between source and drain electrodes and a pixel electrode.

The organic thin film layer may be formed with a resin material that contains a photosensitive material, and thickness of the organic thin film layer may be in the range of 2 μm to 4 μm (its thickness is larger than thickness of a passivation layer). The organic thin film layer may be formed on a source electrode and a drain electrode, and has a via hole established in a region corresponding to the drain electrode, and the drain electrode may be electrically connected to a pixel electrode through the via hole.

Accordingly, a manufacturing method of the array substrate according to the embodiment is: deposition of a gate electrode→formation of a gate electrode through one patterning process with a common mask→deposition of a gate insulating layer→deposition of an active layer→formation of the active layer through one patterning process with a common mask→deposition of a metal thin film→formation of a source electrode and a drain electrode through one patterning process with a common mask→deposition of an organic thin film layer→formation of pattern of the organic thin film layer through one patterning process with a common mask→deposition of a pixel electrode→formation of the pixel electrode through one patterning process with a common mask→deposition of a passivation layer→formation of the passivation layer through one patterning process with a common mask→deposition of a common electrode→formation of the common electrode through one patterning process with a half-tone mask or a gray-tone mask.

Other structures of the array substrate in the embodiment are the same as structures of the array substrate in the first or second embodiment, and other steps of the manufacturing method are the same as the manufacturing method of the array substrate in the first or second embodiment, details being omitted here.

In the array substrate according to the embodiment, as the organic thin film layer is provided between source and drain electrodes and the pixel electrode, it is possible that coupling capacitance in the array substrate is further decreased, an influence of the coupling capacitance on the common electrode is weakened, and voltage distribution on the common electrode is ensured to be more even and more stable. Thus, a better quality of picture display can be achieved by the display device.

Fourth Embodiment

The difference between the embodiment of the first and second embodiments lies in that, an active layer in an array substrate according to the embodiment is formed with a metal oxide semiconductor.

In the embodiment, the active layer may be formed with at least one material of indium gallium zinc oxide (IGZO), indium zinc oxide, indium tin oxide and indium gallium tin oxide.

In the embodiment, as the active layer is formed with a metal oxide semiconductor, the electron mobility between a source electrode and a drain electrode is increased. Therefore, the electron mobility between the source electrode and the drain electrode can be improved better.

Other structures of the array substrate in the embodiment are the same as structures of any array substrate in the first to third embodiments, and other steps of the manufacturing method are the same as the manufacturing method of any array substrate in the first to third embodiments, details being omitted here.

It shall be understood that, although the pixel electrodes in the first to fourth embodiments are formed into a plate shape and common electrodes are formed into a slit shape, the invention is not limited thereto. For selection, the pixel electrodes may be in the shape of a slit, and the common electrodes may be in the shape of a plate, as long as it is ensured that the electrode on top is in the shape of a slit and the electrode underneath is in the shape of a plate.

According to an embodiment of the invention, there is further provided a display device, comprising any of the above-mentioned array substrate. The display device may be: a liquid crystal panel, an electron paper, an OLED panel, a cell phone, a tablet computer, a television, a display, a notebook computer, a digital photo frame, a navigator or any other product or component having a display function.

In the first to fourth embodiments, such a structure that thickness of a zone of a common electrode corresponding to a non-pixel region (specifically, thickness of a zone corresponding to scan lines and/or data lines) in a bottom-gate thin film transistor array substrate is larger than thickness of a zone of the common electrode corresponding to sub-pixel regions is only given as an example, to describe in detail the structure and manufacturing method of an array substrate. However, it should be understood that, the above structure in which the common electrode has different thicknesses in the non-pixel region and the sub-pixel regions is also applicable to a top-gate thin film transistor array substrate, and the only thing we need to do in the course of design and production is to make an adaptable adjustment.

In the first to fourth embodiments, by means of arranging the common electrode to have such a structure that thickness of its zone corresponding to scan lines and/or data lines in a non-pixel region is larger than thickness of its zone corresponding to sub-pixel regions, and accordingly, achieving manufacture of such a structure of the common electrode with unequal thicknesses with the use of an ashing process, the ability of conductivity of the common electrode can be enhanced, and this makes the voltage distribution on the whole liquid crystal display panel for the common electrode be more even and more stable. Thus, the display quality of picture is improved, and the quality grade of the display device is promoted.

It can be understood that, the above embodiments are merely exemplary embodiments used for explaining the principle of the invention, but the invention is not limited thereto. For those ordinarily skilled in the art, various variants and improvements can be made without departing from the spirit and essence of the invention, and these variants and improvements are also regarded as the protection scope of the invention.

The invention claimed is:

1. An array substrate, comprising a non-pixel region distributed in a form of grid and a plurality of sub-pixel regions formed by being surrounded by the non-pixel region, a plurality of scan lines and data lines disposed in a crossing manner being provided within the non-pixel region, wherein a common electrode is provided in the sub-pixel regions and the non-pixel region, a zone of the common electrode corresponding to the sub-pixel regions has a first thickness, a zone of the common electrode corresponding to the scan lines and/or the data lines has a second thickness, and the first thickness is smaller than the second thickness.

2. The array substrate according to claim 1, wherein the common electrode is formed with at least one material selected from the group consisting of indium gallium zinc oxide, indium zinc oxide, indium tin oxide or indium gallium tin oxide.

3. The array substrate according to claim 1, wherein a portion of the common electrode from its bottom surface to the first thickness in a region corresponding to the sub-pixel regions, the scan lines and/or the data lines is formed with at least one material selected from the group consisting of indium gallium zinc oxide, indium zinc oxide, indium tin oxide or indium gallium tin oxide; and a portion of the common electrode from the first thickness to the second thickness in a region corresponding to the scan lines and/or the data lines is formed with at least one material selected from the group consisting of molybdenum, an alloy of molybdenum and niobium, aluminum, an alloy of aluminum and neodymium, titanium or copper.

4. The array substrate according to claim 1, wherein, a gate electrode, a gate insulating layer, an active layer, a source electrode and a drain electrode, a pixel electrode and a passivation layer are provided within the sub-pixel regions, the scan line is electrically connected to the gate electrode, the data line is electrically connected to the source electrode, the pixel electrode is electrically connected to the drain electrode, and the common electrode is extended to cover the scan lines and/or the data lines.

5. The array substrate according to claim 4, wherein, an organic thin film layer is provided between the source electrode, the drain electrode and the pixel electrode, and is formed with a resin material containing a photosensitive material.

6. The array substrate according to claim 4, wherein, the active layer is formed with at least one material selected from the group consisting of indium gallium zinc oxide, indium zinc oxide, indium tin oxide or indium gallium tin oxide; or, the active layer is formed with amorphous silicon material.

7. The array substrate according to claim 4, wherein, the common electrode is disposed on the passivation layer, and is distributed in a form of slit within a region corresponding to the sub-pixel regions;
or, the pixel electrode is disposed on the passivation layer, and is distributed in the form of slit within a region corresponding to the sub-pixel regions.

8. The array substrate according to claim 1, wherein, the second thickness is in the range of 550 Å to 1000 Å, and the first thickness is in the range of 300 Å to 500 Å.

9. A display device, comprising the array substrate according to claim 1.

10. A manufacturing method of an array substrate, comprising:
a step of forming a plurality of scan lines and data lines disposed in a crossing manner, wherein the array substrate is divided by the scan lines and the data lines into a non-pixel region distributed in a form of grid and a plurality of sub-pixel regions formed by being surrounded by the non-pixel region; and
a step of forming a pattern including a common electrode in the sub-pixel regions and the non-pixel region, wherein a zone of the common electrode corresponding to the sub-pixel regions has a first thickness, a zone of the common electrode corresponding the scan lines and/or the data lines has a second thickness, and the first thickness is smaller than the second thickness.

11. The manufacturing method according to claim 10, wherein, forming the pattern including the common electrode includes the following steps:
Step S11): forming a conductive film layer;
Step S12): forming a photoresist layer on the conductive film layer;
Step S13): conducting exposure and development on the photoresist layer with a double-tone mask so that the photoresist layer is provided with a fully-retained region, a partially-retained region and a fully-removed region, the photoresist of the photoresist layer corresponding to the fully-retained region being fully retained, the photoresist corresponding to the partially-retained region being partially retained, and the photoresist corresponding to the fully-removed region being fully removed;
Step S14): performing an etch on the conductive film layer subjected to the step S13), so as to form slits of the common electrode in a region corresponding to the sub-pixel regions;
Step S15): conducting an ashing treatment on the photoresist layer subjected to the step S14), so as to remove the partially-retained photoresist in the photoresist layer by ashing;
Step S16): performing an etch on the conductive film layer subjected to the step S15), so as to decrease thickness of the conductive film layer within the sub-pixel regions, and meanwhile, to form pattern of the common electrode in a region corresponding to the scan lines and/or the data lines; and
Step S17): stripping off the remaining photoresist.

12. The manufacturing method according to claim 11, wherein, in the step S11), the conductive film layer is formed by way of deposition, sputtering or thermal evaporation with at least one material selected from the group consisting of indium gallium zinc oxide, indium zinc oxide, indium tin oxide or indium gallium tin oxide, wherein, a thickness of the conductive film layer is equal to the second thickness.

13. The manufacturing method according to claim 11, wherein, in the step S11), the conductive film layer includes a first conductive film layer and a second conductive film layer, firstly, the first conductive film layer is formed by way of deposition, sputtering or thermal evaporation with at least one material selected from the group consisting of indium gallium zinc oxide, indium zinc oxide, indium tin oxide and indium gallium tin oxide; then, the second conductive film layer is formed on the first conductive film layer by way of sputtering or thermal evaporation with at least one material selected from the group consisting of molybdenum, an alloy of molybdenum and niobium, aluminum, an alloy of aluminum and neodymium, titanium or copper, wherein, a thickness of the first conductive film layer is equal to the first thickness, and a thickness of the second conductive film layer is equal to difference between the second thickness and the first thickness.

14. The manufacturing method according to claim 13, wherein, in the step S16), after the etch, the second conductive film layer within the sub-pixel regions is removed completely and the first conductive film layer within the sub-pixel regions is exposed fully.

15. The manufacturing method according to claim 11, wherein, in the step S13), for the double-tone mask, its zone corresponding to slits of the common electrode is set as the fully-removed region, its zone corresponding to other portion than the slits within the sub-pixel regions is set as the partially-retained region, and its zone corresponding to the scan lines and/or the data lines is set as the fully-retained region.

16. The array substrate according to claim 2, wherein, a gate electrode, a gate insulating layer, an active layer, a source electrode and a drain electrode, a pixel electrode and a passivation layer are provided within the sub-pixel regions, the scan line is electrically connected to the gate electrode, the data line is electrically connected to the source electrode, the pixel electrode is electrically connected to the drain electrode, and the common electrode is extended to cover the scan lines and/or the data lines.

17. The array substrate according to claim 3, wherein, a gate electrode, a gate insulating layer, an active layer, a source electrode and a drain electrode, a pixel electrode and a passivation layer are provided within the sub-pixel regions, the scan line is electrically connected to the gate electrode, the data line is electrically connected to the source electrode, the pixel electrode is electrically connected to the drain electrode, and the common electrode is extended to cover the scan lines and/or the data lines.

18. The array substrate according to claim 2, wherein, an organic thin film layer is provided between the source electrode, the drain electrode and the pixel electrode, and is formed with a resin material containing a photosensitive material.

19. The array substrate according to claim 3, wherein, an organic thin film layer is provided between the source electrode, the drain electrode and the pixel electrode, and is formed with a resin material containing a photosensitive material.

20. The array substrate according to claim 2, wherein, the second thickness is in the range of 550 Å to 1000 Å, and the first thickness is in the range of 300 Å to 500 Å.

* * * * *